(12) United States Patent
Lee et al.

(10) Patent No.: US 11,398,437 B2
(45) Date of Patent: Jul. 26, 2022

(54) POWER DEVICE INCLUDING METAL LAYER

(71) Applicant: SEMICONDUCTOR COMPONENTS INDUSTRIES, LLC, Phoenix, AZ (US)

(72) Inventors: Bongyong Lee, Seoul (KR); Bohee Kang, Bucheon (KR); Doojin Choi, Gimpo-si (KR); Kyeongseok Park, Bucheon (KR); Thomas Neyer, Munich (DE); Jeongwoo Yang, Goyang-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/714,249

(22) Filed: Dec. 13, 2019

(65) Prior Publication Data
US 2021/0183788 A1 Jun. 17, 2021

(51) Int. Cl.
*H01L 23/00* (2006.01)
*H01L 29/78* (2006.01)
(52) U.S. Cl.
CPC ........ *H01L 23/562* (2013.01); *H01L 29/7811* (2013.01); *H01L 29/7813* (2013.01)
(58) Field of Classification Search
CPC ............... H01L 23/562; H01L 29/7813; H01L 29/7811; H01L 23/00; H01L 29/78
USPC ........................................................ 257/288
See application file for complete search history.

(56) References Cited

U.S. PATENT DOCUMENTS

| | | | |
|---|---|---|---|
| 8,502,313 B2 | 8/2013 | Dikshit et al. | |
| 10,600,738 B2* | 3/2020 | Noda | H01L 23/291 |
| 2003/0059986 A1* | 3/2003 | Shibata | H01L 29/78696 438/149 |
| 2006/0255719 A1* | 11/2006 | Oikawa | H05B 33/10 313/503 |
| 2011/0133193 A1* | 6/2011 | Song | H01L 29/78669 257/E21.414 |
| 2013/0033925 A1* | 2/2013 | Yamazaki | H01L 27/1225 365/149 |
| 2014/0312369 A1* | 10/2014 | Yoon | H01L 33/40 257/96 |
| 2015/0325535 A1 | 11/2015 | Henneck et al. | |
| 2017/0084632 A1* | 3/2017 | Shinokawa | H01L 27/124 |
| 2017/0271456 A1* | 9/2017 | Ohse | H01L 29/1608 |

(Continued)

FOREIGN PATENT DOCUMENTS

| | | | | |
|---|---|---|---|---|
| CN | 103003966 A | * | 3/2013 | ..... H01L 2224/1403 |
| DE | 11 2017 001 788 T5 | * | 12/2018 | ............. H01L 29/78 |
| WO | 2019123717 A1 | * | 6/2019 | ............. H01L 29/06 |

*Primary Examiner* — Alexander O Williams
(74) *Attorney, Agent, or Firm* — Brake Hughes Bellermann LLP

(57) ABSTRACT

A power semiconductor device includes a substrate having an edge, an insulating layer disposed over the substrate, a metal layer disposed over the insulating layer and including a first portion and a second portion, a coating layer disposed over the metal layer, and a protective layer covering the substrate, the insulating layer, the metal layer, and the coating layer. The first portion has a first thickness and the second portion has a second thickness that is greater than the first thickness, and the second portion is disposed farther apart from the edge of the substrate than the first portion.

20 Claims, 4 Drawing Sheets

(56) References Cited

U.S. PATENT DOCUMENTS

2018/0269163 A1* 9/2018 Iwamizu ......... H01L 21/823475
2020/0312995 A1* 10/2020 Nagahisa ............ H01L 29/7811

* cited by examiner

POWER DEVICE INCLUDING METAL LAYER

FIELD OF THE DISCLOSURE

The present disclosure relates to a power semiconductor device, in particular a power device including a metal layer.

BACKGROUND

Power semiconductor devices are used in many different industries. Some of these industries, such as telecommunications, computing and charging systems, are rapidly developing.

Power semiconductor devices may have a packaged structure for protecting integrated circuits (ICs) from physical or chemical attack. For example, such a packaged structure includes a substrate, one or more insulating layers, a metal layer, and an encapsulating layer. Mismatch of coefficient of thermal expansion (CTE) between constituent materials of the packaged structure may induce thermal deformations and stresses, which may deteriorate yield, service life, and reliability of the power semiconductor devices. For example, tensile stresses may be generated in one or more insulating layers of the packaged structure during a manufacturing process of the power semiconductor devices, leading to an occurrence of cracks in these insulating layers to reduce the yield of the power semiconductor devices.

SUMMARY

Embodiments of the present application relate to a power semiconductor device including a substrate and a metal layer, where the substrate has an edge and the metal layer includes a first portion and a second portion. The second portion is disposed farther apart from the edge of the substrate than the first portion. The first portion of the metal layer has a first thickness smaller than a second thickness of the second portion, and thereby reducing stresses exerted on the first portion during a thermal process.

In an embodiment of, a power semiconductor device includes a substrate having an edge, an insulating layer disposed over the substrate, a metal layer disposed over the insulating layer and including a first portion and a second portion, a coating layer disposed over the metal layer, and a protective layer covering the substrate, the insulating layer, the metal layer, and the coating layer. The first portion has a first thickness and the second portion has a second thickness that is greater than the first thickness, and the second portion is disposed farther apart from the edge of the substrate than the first portion.

In an embodiment of the above device, the first thickness of the first portion is in a range from 20% to 60% of the second thickness of the second portion.

In an embodiment, a method of forming a power semiconductor device includes forming an insulating layer over a substrate, forming a first metal material layer over the insulating layer, forming a second metal material layer over the first metal material layer, etching the second metal material layer to form a second metal pattern, and etching the first metal material layer to form a first metal pattern. An outer edge of the second metal pattern is disposed farther than an outer edge of the first metal pattern from an edge of the substrate.

In an embodiment, a power semiconductor device includes a substrate having an edge, a first insulating layer disposed over the substrate, a second insulating layer disposed over the first insulating layer, a metal layer disposed over the second insulating layer and including a first portion and a second portion, a passivation layer disposed over the second insulating layer and the metal layer, a coating layer disposed over the passivation layer, and a protective layer covering the substrate, the first insulating layer, the second insulating layer, the metal layer, the passivation layer, and the coating layer. The first portion has a first thickness and the second portion has a second thickness that is greater than the first thickness, and the second portion is disposed farther apart from the edge of the substrate than the first portion.

DETAILED DESCRIPTION

Figure 1A:
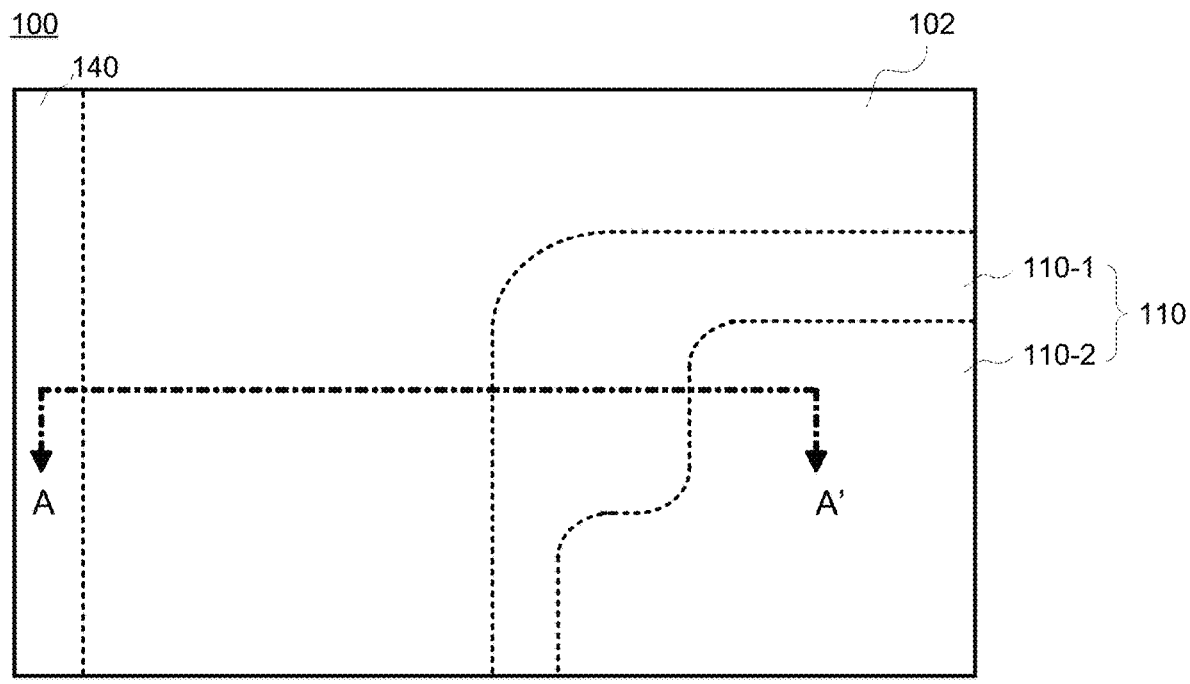
FIGS. 1A and 1B illustrate a power semiconductor device including a metal layer according to an embodiment.

Embodiments of the present application relate to a power semiconductor device including a substrate and a metal layer. The metal layer includes a first portion and a second portion that is disposed farther apart from an edge of the substrate than the first portion. The first portion of the metal layer has a first thickness smaller than a second thickness of the second portion, and stresses exerted on the first portion during a thermal process may be reduced. For example, the first portion has a thickness in a range from 1 μm to 2 μm, and the second portion has a thickness in a range from 4 μm to 5 μm. In an embodiment, the first portion and the second portion form a single integrated body, thereby deforming to absorb a portion of stresses exerted on the metal layer in the form of elastic energy. A distance between an outer edge of the first portion and an outer edge of the second portion is relatively long to further reduce stresses exerted on the second portion during the thermal process. In an embodiment, the metal layer includes a material having relatively high hardness to make the metal layer more resistant to the stresses applied thereon. For example, the metal layer includes an alloy of Al, Cu, and W.

The power semiconductor device further includes a coating layer disposed over the metal layer and a protective layer covering the substrate, the metal layer, and the coating layer. The coating layer has a thickness that is relatively thick to reduce the stresses exerted on the metal layer. For example, the thickness of the coating layer is equal to or greater than 9 μm. The protective layer has one or more material properties similar to those of the substrate to reduce stresses generated in an upper portion of the power device. For example, the protective layer has a coefficient of thermal expansion (CTE) that is in a range from $3.4*10^{-6}/°$ C. to $8.0*10^{-6}/°$ C. whereas a CTE of the substrate (e.g., SiC substrate) is in a range from $4.2*10^{-6}/°$ C. to $4.4*10^{-6}/°$ C.

A detailed description of embodiments is provided below along with accompanying figures. The scope of this disclosure is limited only by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

Figure 1B:
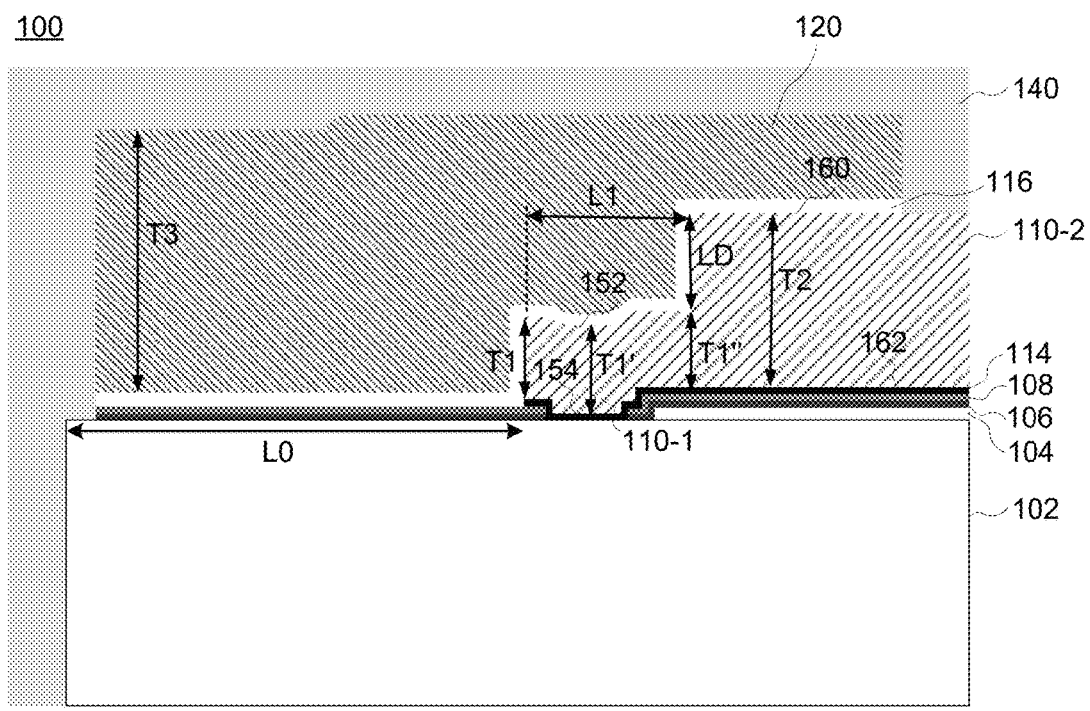

FIGS. 1A and 1B illustrate a power semiconductor device 100 according to an embodiment of the present disclosure. FIG. 1A is a plan view of the power semiconductor device 100, and FIG. 1B is a cross-sectional view along a line A-A' of FIG. 1A.

In the embodiment shown in FIGS. 1A and 1B, the power device 100 is a power metal oxide semiconductor field effect transistor (MOSFET) device. For example, such a MOSFET device may have a horizontal channel structure or a vertical channel structure. In other embodiments, the power device 100 may be other power devices such as a diode device, an insulated gate bipolar transistor (IGBT) device, or the like.

The power device 100 includes a semiconductor substrate 102. In an embodiment, the substrate 102 includes a semiconductor compound such as a group IV compound semiconductor substrate, a group III-V compound semiconductor substrate, or a group II-VI oxide semiconductor substrate. For example, the substrate 102 includes silicon carbide (SiC) substrate, gallium nitride (GaN) substrate, or gallium arsenide (GaAs) substrate.

A gate dielectric layer (not shown) is disposed between each of one or more gate electrodes 104 and the semiconductor substrate 102. A first insulating layer 106 is disposed over the semiconductor substrate 102 and the gate electrodes 104, and includes an oxide or a nitride. A second insulating layer 108 is disposed over the first insulating layer 106, and includes an oxide or a nitride. The first insulating layer 106 and the second insulating layer 108 insulate the gate electrodes 104 from a metal layer 110. Although the embodiment shown in FIG. 1B includes two insulating layers 106 and 108, embodiments of the present disclosure are not limited thereto. For example, a single insulating layer (not shown) may replace the first and second insulating layers 106 and 108.

The metal layer 110 includes a first portion 110-1 and a second portion 110-2. The second portion 110-2 is disposed farther from an edge of the substrate 102 than the first portion 110-1. In the embodiment shown in FIG. 1B, an outer edge of the first portion 110-1 is spaced apart from the edge of the substrate 102 by a first distance L0 in a horizontal direction with respect to the orientation of FIG. 1B, and an outer edge of the second portion 110-2 is spaced apart from the outer edge of the first portion 110-1 by a second distance L1 in the horizontal direction. For example, the first distance L0 is equal to or greater than 30 μm, and the second distance L1 is in a range from equal to or greater than 20 μm. In addition, the first portion 110-1 has a thickness T1 that is smaller than a thickness T2 of the second portion 110-2. For example, the thickness T1 of the first portion 110-1 may be in a range from 20% to 60% of the thickness T2 of the second portion 110-2, and a level difference LD between the thickness T1 of the first portion 110-1 and the thickness T2 of the second portion 110-2 may be in a range from 40% to 80% of the thickness T2 of the second portion 110-2. In the embodiment shown in FIG. 1B, the thickness T1 of the first portion 110-1 is a distance between an upper surface 152 and a lower surface 154 of the first portion 110-1 in a vertical direction with respect to the orientation of FIG. 1B. In an embodiment, the lower surface 154 contacts the top of the barrier layer 114, and the upper surface 152 has a similar profile to that of the lower surface 154 along the horizontal direction of FIG. 1B. FIG. 1B shows three thicknesses T1, T1', and T1" at an outer edge of the first portion 110-1, in an recessed portion of the first portion 110-1, and at an inner edge of the first portion 110-1, respectively, and these thicknesses T1, T1', and T1" of the first portion 110-1 may be substantially the same. For example, a difference between the maximum value and the minimum value among the thicknesses T1, T1', and T1" of the first portion 110-1 may be equal to or less than 5% of the minimum value. The thickness T2 of the second portion 110-2 is a distance between an upper surface 160 and a lower surface 162 of the second portion 110-2. Similarly, the second portion 110-2 has substantially the same thickness T2 along the horizontal direction of FIG. 1B.

The barrier layer 114 is disposed between the metal layer 110 and the second insulating layer 108, and serves to substantially block migration of metal ions from the metal layer 110 to the second insulating layer 108, or improve adhesion characteristics of the metal layer 110, or both. For example, the barrier layer 114 includes Titanium (Ti), Titanium nitride (TiN), Tantalum (Ta), or a combination thereof.

Although not shown in the embodiment of FIG. 1B, a conductive layer (not shown) may be disposed between the metal layer 110 and the substrate 102 to electrically couple between the metal layer 110 and one or more portions (e.g., a source region or a drain region) of the substrate 102. For example, such a conductive layer is a silicide layer and includes a plurality of portions each functioning as a source electrode or a drain electrode. In addition, although not shown in the embodiment of FIG. 1B, an etch stop layer (e.g., an etch stop layer 232' in FIG. 2D) may be disposed within the second portion 110-2.

A passivation layer 116 is disposed over the second insulating layer 108 and the metal layer 110. In an embodiment, the passivation layer 116 includes the same material as that of the first insulating layer 106, or that of the second insulating layer 108, or both. For example, the passivation layer 116 includes an oxide or a nitride.

A coating layer 120 is disposed between the passivation layer 116 and a protective layer 140, and serves to reduce chip stress and substantially block migration of ions from the protective layer 140 to chip circuitry of the power device 100. For example, the coating layer 120 covers the passivation layer 116 and the first and second portions 110-1 and 110-2 of the metal layer 110, and includes polyimide.

The protective layer 140 covers the substrate 102, the first insulating layer 106, the second insulating layer 108, the metal layer 110, the passivation layer 116, and the coating layer 120, and serves to protect the chip circuitry of the power device 100 from physical or chemical attack. In an embodiment, the protective layer 140 includes epoxy molding compound (EMC) material, and the EMC material includes silica, epoxy resin, hardener, flame retardant, catalyst, stress relaxation additive, and the like.

As described above, the power device 100 in FIG. 1B has a packaged structure to protect the chip circuitry of the power device 100 from physical or chemical attack. When a thermal process is performed on such a packaged structure, thermal deformations and stresses in the power device 100 may be induced, and thus the integrity and reliability of the packaged structure of the power device 100 may be deteriorated. For example, when a cooling process is performed on the protective layer 140, the protective layer 140 shrinks to exert compressive stresses on a side surface of the coating layer 120 and exert compressive stresses and shear stresses on a top surface of the coating layer 120. These stresses may propagate through the coating layer 120 and the propagated stresses may be exerted on the metal layer 110 to shift the metal layer 110 in a specific direction (e.g., a right direction with respect to the orientation of FIG. 1B), thereby generating tensile stresses in one or more of the first insulating layer 106, the second insulating layer 108, and the passivation layer 116. The propagated stresses may also generate a bending moment in a specific direction (e.g., a clockwise direction with respect to the orientation of FIG. 1B) that pulls a bottom surface of the metal layer 110 apart from a top surface of the second insulating layer 108. These tensile stresses and bending moment may lead to an occurrence of cracks in one or more of the first insulating layer 106, the second insulating layer 108, and the passivation layer 116.

When a heating process may be performed on the packaged structure under a reliability test of the power device 100, the substrate 102 has a higher coefficient of thermal expansion (CTE) than that of each of the first insulating layer 106, the second insulating layer 108, and the passivation layer 116, and thus the substrate 102 expands more than these layers 106, 108, and 116. The metal layer 110 also has a higher CTE than that of each of the first insulating layer 106, the second insulating layer 108, and the passivation layer 116, and thus the metal layer 110 expands more than the layers 106, 108, and 116. As a result, tensile stresses are generated in one or more of the first insulating layer 106, the second insulating layer 108, and the passivation layer 116. These tensile stresses may lead to an occurrence of cracks in one or more of the first insulating layer 106, the second insulating layer 108, and the passivation layer 116.

In an embodiment, the coating layer 120 has a thickness T3 that is relatively thick to reduce the propagated stresses therethrough. Because the stresses exerted on the metal layer 110 are reduced, shifting of the metal layer 110 may be reduced and the tensile stresses generated in one or more of the first insulating layer 106, the second insulating layer 108, and the passivation layer 116 may be reduced. The bending moment to pull apart the metal layer 110 from the second insulating layer 108 may be also reduced.

In an embodiment, the thickness T1 of the first portion 110-1 of the metal layer 110 is sufficiently thick to properly serve as an electrical connection, whereas the thickness T1 of the first portion 110-1 is sufficiently thin to minimize a vertical cross-sectional area of the first portion 110-1 on which the propagated stresses through the coating layer 120 are exerted. For example, the thickness of T1 of the first portion 110-1 is in a range from 1 μm to 2 μm. Because the first portion 110-1 of the metal layer 110 has a relatively thin thickness T1, the vertical cross-sectional area of the first portion 110-1 on which the propagated stresses are exerted may be reduced, thereby reducing forces exerted on the vertical cross-sectional area of the first portion 110-1. As a result, shifting of the first portion 110-1 during a thermal process may be reduced, thereby reducing the tensile stresses generated in one or more of the first insulating layer 106, the second insulating layer 108, and the passivation layer 116. The bending moment to pull apart the metal layer 110 from the second insulating layer 108 may be also reduced.

Similarly, the thickness T2 of the second portion 110-2 may be sufficiently thin to minimize a vertical cross-sectional area of the second portion 110-2 on which the propagated stresses through the coating layer 120 are exerted. On the other hand, the thickness T2 of the second portion 110-2 may be sufficiently large to properly function as an electric pad when a wire bonding process is performed on the second portion 110-2. For example, the thickness of T2 of the second portion 110-2 is in a range from 4 μm to 5 μm. In addition, the distance L1 between the outer edge of the first portion 110-1 and the outer edge of the second portion 110-2 is relatively long to further reduce the stresses exerted on the second portion 110-2. For example, the distance L1 is equal to or greater than 20 μm. As a result, shifting of the second portion 110-2 during a thermal process may be reduced, thereby reducing the tensile stresses generated in one or more of the first insulating layer 106, the second insulating layer 108, and the passivation layer 116. The bending moment to pull apart the metal layer 110 from the second insulating layer 108 may be also reduced.

In an embodiment, the first portion 110-1 and the second portion 110-2 form a single integrated body, thereby deforming to absorb a portion of the stresses exerted thereon in the form of elastic energy. As a result, shifting of the metal layer 110 during a thermal process may be reduced, thereby reducing the tensile stresses generated in one or more of the first insulating layer 106, the second insulating layer 108, and the passivation layer 116. The bending moment to pull apart the metal layer 110 from the second insulating layer 108 may be also reduced.

In an embodiment, the protective layer 140 has one or more material properties similar to those of the substrate 102. For example, a CTE of the protective layer 140 is in a range from $3.4*10^{-6}/°$ C. to $8.0*10^{-6}/°$ C. whereas a CTE of the substrate 102 is in a range from $4.2*10^{-6}/°$ C. to $4.4*10^{-6}/°$ C. Because the protective layer 140 has material properties similar to those of the substrate 102, stresses generated in an upper portion (e.g., the first insulating layer 106, the second insulating layer 108, and the passivation layer 116) of the power device 100 due to a difference in the material properties between the protective layer 140 and the substrate 120 during a thermal process may be further reduced.

In an embodiment, the metal layer 110 includes a material having relatively high hardness. For example, the metal layer 110 includes an alloy of Al, Cu, and W that has hardness in a range from 0.63 GPa to 0.67 GPa. When the material in the metal layer 110 has relatively high hardness, the material may also have a relatively high elastic modulus. Because the hardness and elastic modulus of a material indicate the resistance to localized plastic deformation and the resistance to elastic deformation of the material, respectively, the metal layer 110 may be more resistant to stresses exerted thereon. As a result, shifting of the metal layer 110 during a thermal process may be reduced, thereby reducing the tensile stresses generated in one or more of the first insulating layer 106, the second insulating layer 108, and the passivation layer 116.

As described above, in the power device 100 according to an embodiment of the present disclosure, the tensile stresses generated in one or more of the first insulating layer 106, the second insulating layer 108, and the passivation layer 116 may be reduced. As a result, the tensile stresses generated when a thermal process is performed on the power device 100 may become sufficiently low to substantially prevent an occurrence of cracks in one or more of the first insulating layer 106, the second insulating layer 108, and the passivation layer 116. In addition, the bending moment to pull apart the metal layer 110 from the second insulating layer 108 may be reduced, thereby further reducing the likelihood of such an occurrence of cracks.

FIGS. 2A, 2B, 2C, and 2D illustrate aspects of a method of forming a semiconductor power device (e.g., the power device 100 in FIG. 1) according to an embodiment of this disclosure. More specifically, FIGS. 2A-2D illustrate processes of forming a metal layer (e.g., the metal layer 110 in FIGS. 1A and 1B) according to an embodiment. Descriptions on the remaining processes of forming the power device are omitted herein for the interest of brevity.

Figure 2A:
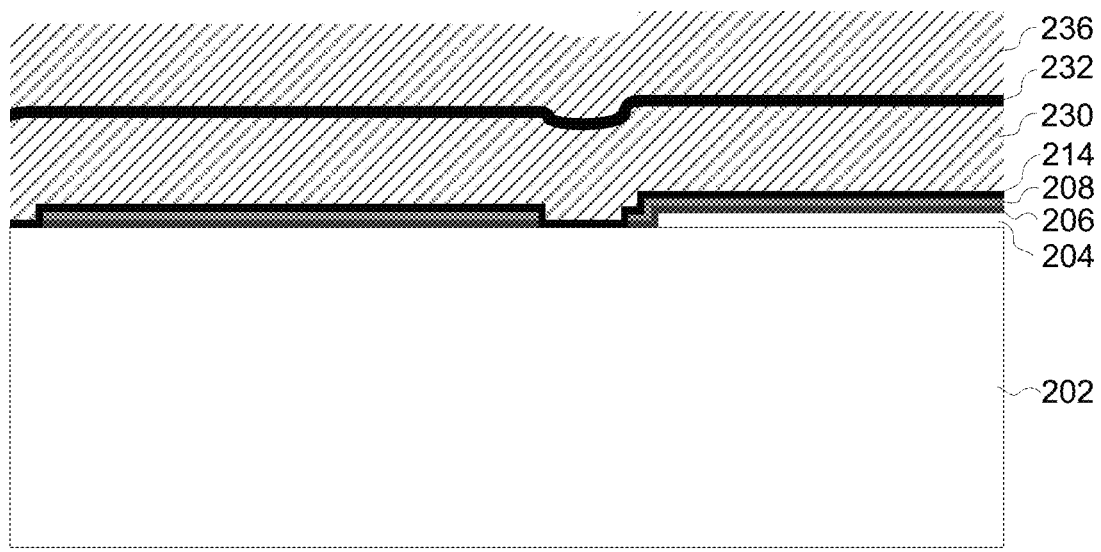
FIGS. 2A, 2B, 2C, and 2D illustrate a process of forming a power semiconductor device according to an embodiment.

In FIG. 2A, a first metal material layer 230, an etch stop material layer 232, and a second metal material layer 236 are formed over a structure including a substrate 202, one or more gate electrodes 204, a first insulating layer 206, a second insulating layer 208, and a barrier material layer 214. The first and second metal material layers 230 and 236 each include a material that is electrically conductive to transmit electrical signals therethrough. In an embodiment, the material includes aluminum (Al), copper (Cu), tungsten (W), platinum (Pt), tantalum (Ta), silicon (Si), or a combination thereof. For example, each of the first and second material layers 230 and 236 may include 0.1% Cu, 0.5% W, and 99.4% Al, or include 0.5% Cu, 0.8% Si, and 98.7% Al. For example, each of the first and second metal material layers 230 and 236 may be deposited using a physical vapor deposition method (e.g., evaporation, DC sputtering, or RF sputtering) or a chemical vapor deposition method (e.g., low-pressure CVD or plasma-enhanced CVD). The first and second material layers 230 and 236 may be formed such that each of the first and second material layers 230 and 236 has substantially the same thickness along a horizontal direction with respect to the orientation of FIG. 2A.

The etch stop material layer 232 is formed between the first metal material layer 230 and the second metal material layer 236. In an embodiment, the etch stop material layer 232 includes titanium (Ti) or titanium nitride (TiN). For example, the etch stop material layer 232 may be deposited using a physical vapor deposition method (e.g., sputter deposition, cathodic arc deposition, or electron beam heating) or a chemical vapor deposition method. Although not shown in FIG. 2A, a conductive layer may be formed between the first metal material layer 230 and the substrate 202 to electrically couple the first metal material layer 230 and one or more portions (e.g., a source region or a drain region) of the substrate 202.

Figure 2B:
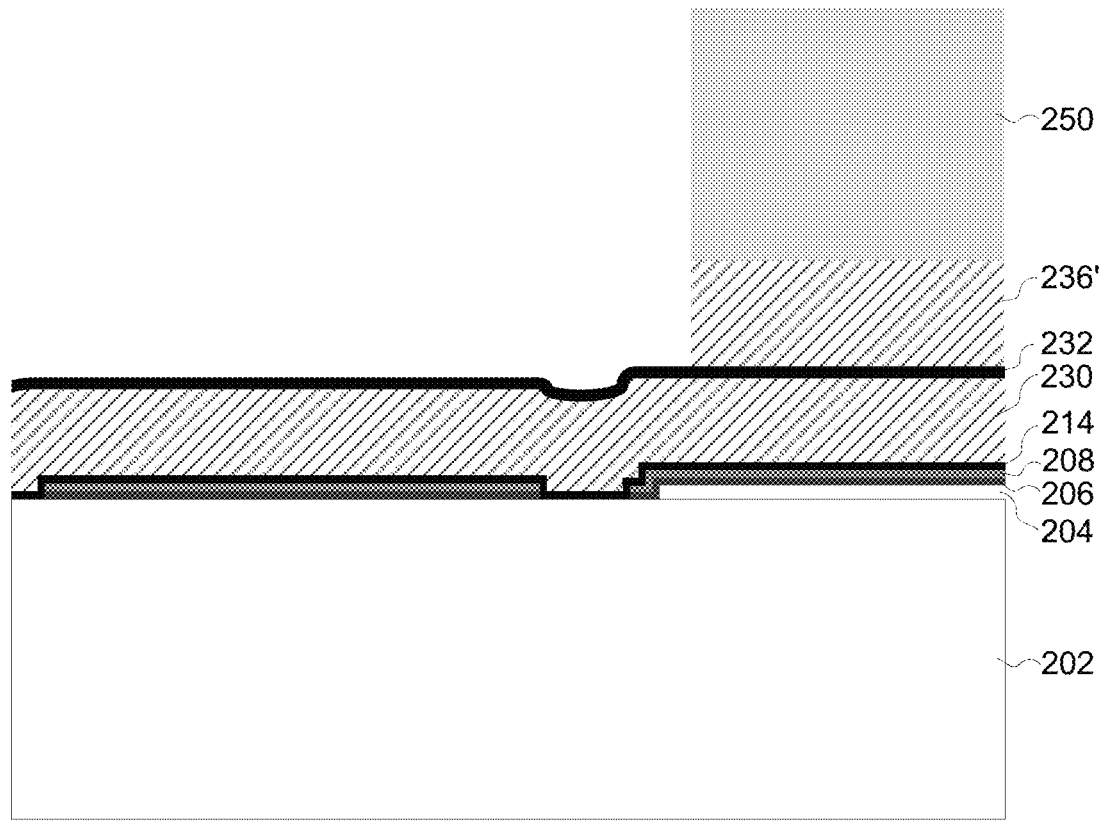

In FIG. 2B, a first mask pattern 250 is formed over the second metal material layer 236, and then a first etching process is performed to form a second metal pattern 236' using the first mask pattern 250. In an embodiment, a wet etching process is performed on the second metal material layer 236 using the first mask pattern 250 that includes a photoresist material. An etching rate of the second metal material layer 236 is higher than that of the etch stop material layer 232, and the first etching process is performed until a portion of the etch stop material layer 232 is exposed.

Figure 2C:
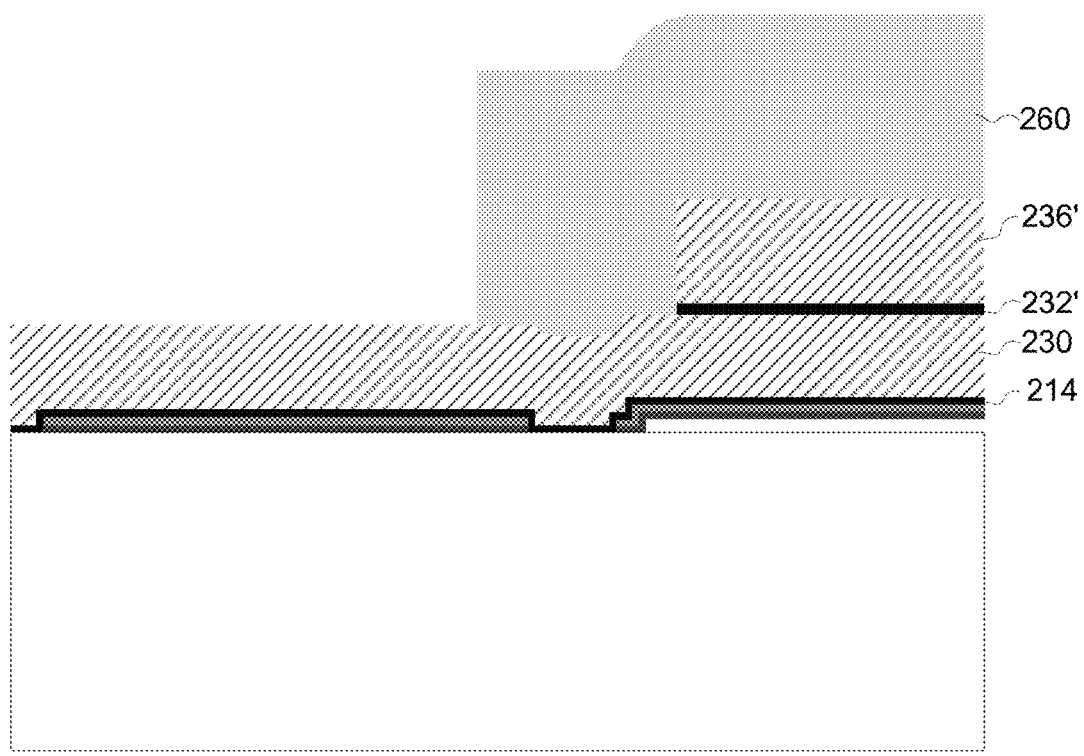

In FIG. 2C, a second etching process is performed to remove the exposed portion of the etch stop material layer 232, thereby forming an etch stop layer 232'. In an embodiment, a dry etching process is performed on the exposed portion of the etch stop material layer 232 to form the etch stop layer 232'. Subsequently, a second mask pattern 260 is formed over the first metal material layer 230 and the second metal pattern 236'.

Figure 2D:
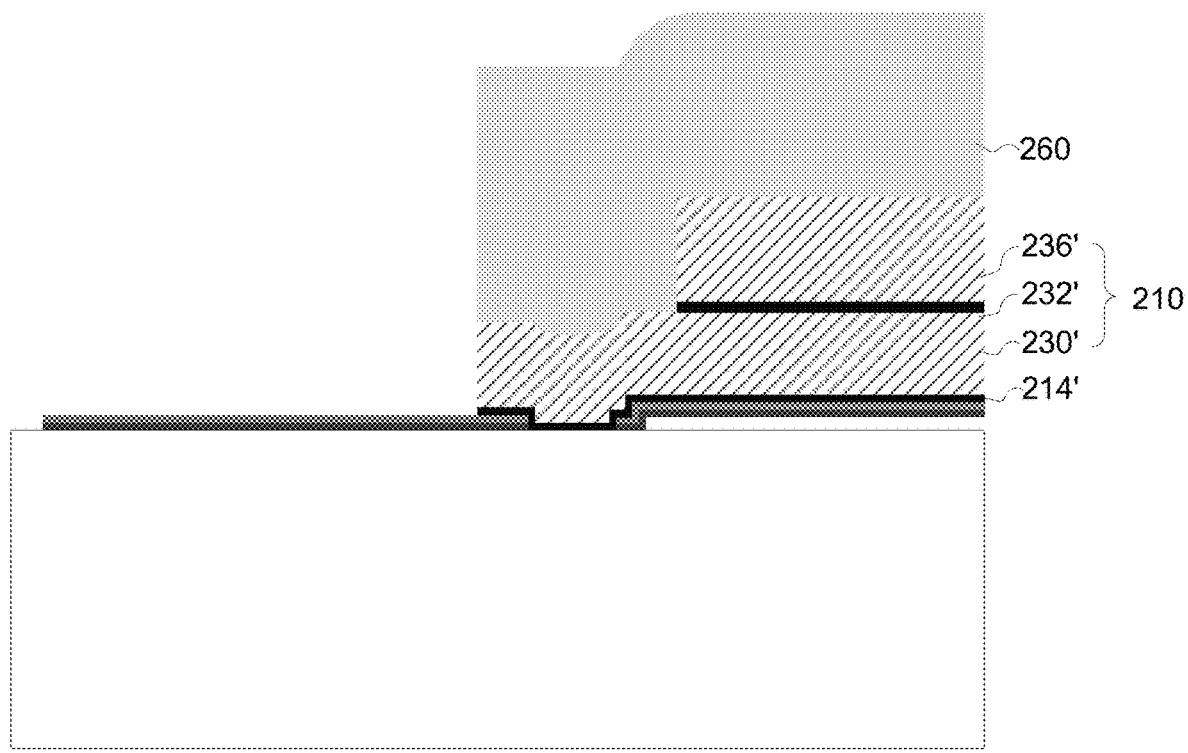

In FIG. 2D, a third etching process is performed on the first metal material layer 230 to form the first metal pattern 230' using the second mask pattern 260. In an embodiment, a wet etching process is performed on the first metal material layer 230 using the second mask pattern 260 until a portion of the barrier material layer 214 is exposed. Subsequently, a fourth etching process is performed on the exposed portion of the barrier material layer 214 to remove the exposed portion of the barrier material layer 214, thereby forming a barrier layer 214'. In an embodiment, a dry etching process is performed on the exposed portion of the barrier material layer 214 to form the barrier layer 214'. As a result, a metal layer 210 including the first metal pattern 230', the etch stop layer 232', and the second metal pattern 236' may be formed. The metal layer 210 may include a first portion that includes an outer portion of the first metal pattern 230' and has a first thickness (e.g., the first thickness T1 in FIG. 1B). The metal layer 210 may further include a second portion that includes an inner portion of the first metal pattern 230', the etch stop layer 232', and the second metal pattern 236' and has a second thickness (e.g., the second thickness T2 in FIG. 1B) that is greater than the first thickness.

Figure 3:
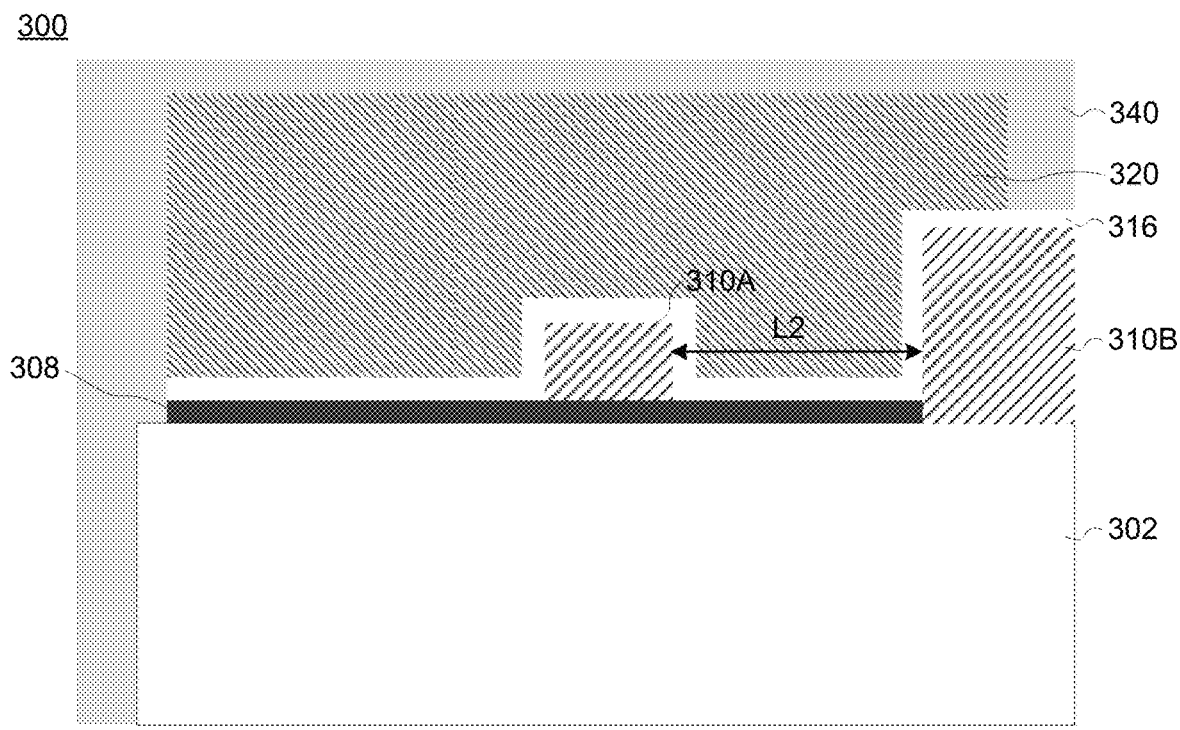
FIG. 3 illustrates a power semiconductor device including a metal layer according to an embodiment.

FIG. 3 illustrate a power semiconductor device 300 according to an embodiment of the present disclosure. The power device 300 includes a semiconductor substrate 302, an insulating layer 308, a passivation layer 316, a first metal layer 310A, a second metal layer 310B, a coating layer 320, and a protective layer 340. Some elements (e.g., a barrier layer, one or more gate electrodes, a gate dielectric layer, and a silicide layer) of the power device 300 are not shown in FIG. 3 for the interest of brevity. Although the embodiment shown in FIG. 3 includes a single insulating layer 308, embodiments of the present disclosure are not limited thereto. For example, the power semiconductor device 300 may include two or more insulating layers (e.g., the first and second insulating layers 106 and 108 in FIG. 1B), rather than the single insulating layer 308.

The power device 300 includes the first metal layer 310A and the second metal layer 310B that are spaced apart from each other by a given distance. Because the first metal layer 310A and the second metal layer 310B are spaced apart from each other, a level difference in an upper surface of the coating layer 320 may be reduced compared to that when a coating layer (e.g., the coating layer 120 in FIG. 1B) is formed over a single metal layer (e.g., the metal layer 110 in FIG. 1B) including two portions (e.g., the first and second portions 110-1 and 110-2 in FIG. 1B) coupled to each other. In an embodiment, the first metal layer 310A and the second metal layer 310B are spaced apart by a distance sufficiently large to minimize a level difference in the upper surface of the coating layer 320. For example, a distance L2 between the first metal layer 310A and the second metal layer 310B is in a range from 4 μm to 8 μm. In an embodiment, the distance L2 between the first metal layer 310A and the second metal layer 310B is about 6 μm, for example, in a range from 5.9 μm to 6.1 μm. As a result, the maximum level difference in the upper surface of the coating layer 320 may be equal to or less than 1.5 μm.

Because the level difference in the upper surface of the coating layer 320 is relatively small, the stresses exerted on the upper surface of the coating layer 320 during a thermal process becomes more uniform compared to when a relatively large level difference in the upper surface of the coating layer 320 would lead to stress concentration in the upper surface. As a result, shifting of the first metal layer 310A during a thermal process may be reduced, thereby reducing tensile stresses generated in the insulating layer 308, or the passivation layer 316, or both. The bending moment to pull apart the first metal layer 310A from the insulating layer 308 may be also reduced. Accordingly, an occurrence of cracks in the insulating layer 308, or the passivation layer 316, or both may be substantially prevented in the power device 300 according to the embodiment shown in FIG. 3.

Figure 4:
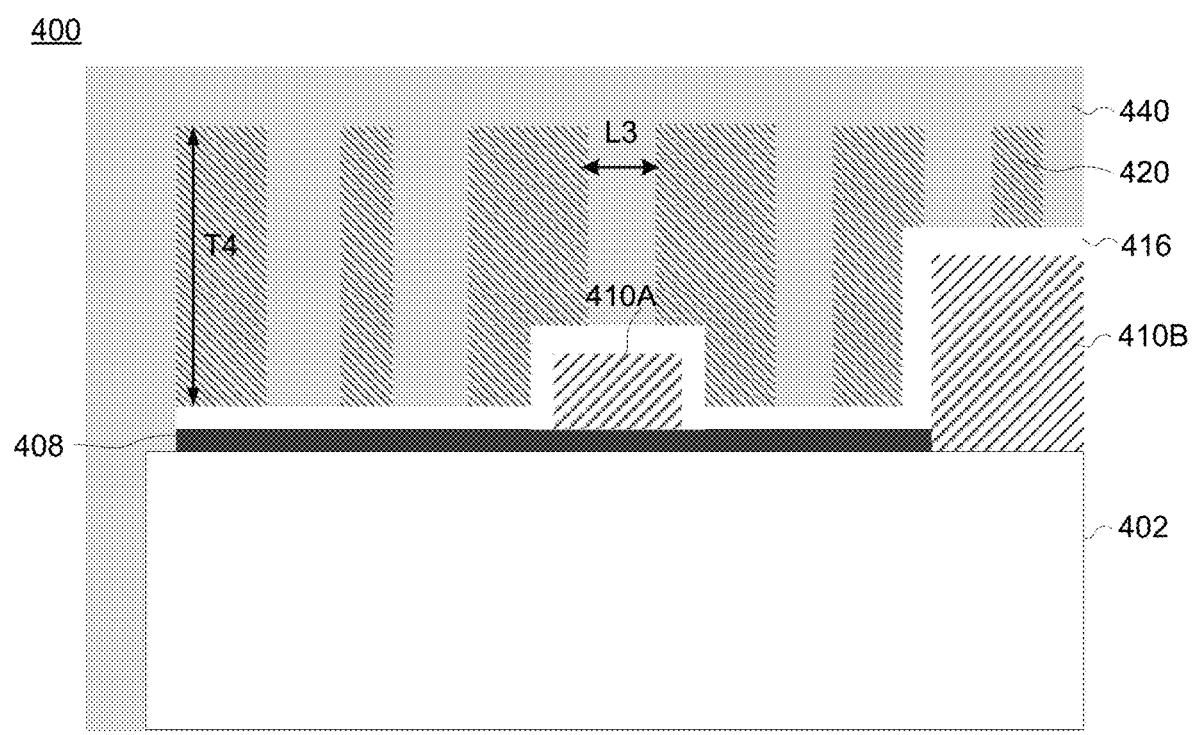
FIG. 4 illustrates a power semiconductor device including a metal layer according to an embodiment.

FIG. 4 illustrate a power semiconductor device 400 according to an embodiment of the present disclosure. The power device 400 includes a semiconductor substrate 402, an insulating layer 408, a passivation layer 416, a first metal layer 410A, a second metal layer 410B, a coating layer 420, and a protective layer 440. Some elements (e.g., a barrier layer, one or more gate electrodes, a gate dielectric layer, and a silicide layer) of the power device 400 are not shown in FIG. 4 for the interest of brevity. Although the embodiment shown in FIG. 4 includes a single insulating layer 408, embodiments of the present disclosure are not limited thereto. For example, the power semiconductor device 400 may include two or more insulating layers (e.g., the first and second insulating layers 106 and 108 in FIG. 1B), rather than the single insulating layer 408.

The coating layer 420 includes a plurality of vertical portions that are spaced apart from each other. In an embodiment, the coating layer 420 has a honeycomb structure including an array of hollow cells formed between adjacent vertical portions. For example, each of the hollow cells may have a specific cross-section (e.g., a hexagon, a square, or a rectangle) when seen in a top view and extend in a direction perpendicular to that cross-section. The protective layer 440 fills a hollow cell between adjacent vertical portions of the coating layer 420.

In an embodiment, a distance L3 between adjacent vertical portions of the coating layer 420 is in a range from 20 µm to 40 µm. Because these adjacent vertical portions of the coating layer 420 are spaced apart from each other, the coating layer 420 may effectively absorb stresses exerted by the protective layer 440 during a thermal process. As a result, a thickness T4 of each of the plurality of portions of the coating layer 420 may be reduced compared to that (e.g., the thickness T3 in FIG. 1B) of a coating layer (e.g., the coating layer 120 in FIG. 1B) without including one or more hollow cells. For example, the thickness T4 of each of the plurality of vertical portions of the coating layer 420 is in a range from 6 µm to 9 µm.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A power semiconductor device, comprising:
a substrate having an edge;
an insulating layer disposed over the substrate;
a metal layer disposed over the insulating layer and including a first portion and a second portion, the first portion having a first thickness and the second portion having a second thickness that is greater than the first thickness, an upper surface of the first portion being at a level different from that of an upper surface of the second portion, the second portion being disposed farther apart from the edge of the substrate than the first portion and having the second thickness sufficiently large to function as a pad on which a wire bonding process is performed;
a coating layer disposed over the metal layer; and
a protective layer covering the substrate, the insulating layer, the metal layer, and the coating layer.

2. The power semiconductor device of claim 1, wherein the first thickness of the first portion is in a range from 20% to 60% of the second thickness of the second portion.

3. The power semiconductor device of claim 1, wherein the first thickness of the first portion is in a range from 1 µm to 2 µm, and the second thickness of the second portion is in a range from 4 µm to 5 µm.

4. The power semiconductor device of claim 1, wherein the first portion and the second portion form a single integrated body.

5. The power semiconductor device of claim 4, wherein a distance between an outer edge of the first portion and an outer edge of the second portion is equal to or greater than 20 µm.

6. The power semiconductor device of claim 1, wherein the first portion is spaced apart from the second portion by a distance in a range from 4 µm to 8 µm.

7. The power semiconductor device of claim 1, wherein the metal layer includes Al, Cu, and W.

8. The power semiconductor device of claim 1, wherein the coating layer has a thickness that is greater than 9 µm.

9. The power semiconductor device of claim 1, wherein the coating layer includes a plurality of portions, an adjacent pair of the plurality of portions being spaced apart by a distance in a range from 20 µm to 40 µm.

10. The power semiconductor device of claim 1, wherein the coating layer has a honeycomb structure.

11. The power semiconductor device of claim 9, wherein the coating layer has a thickness in a range from 6 µm to 9 µm.

12. The power semiconductor device of claim 1, wherein the protective layer has a coefficient of thermal expansion (CTE) in a range from $3.4*10^{-6}/°$ C. to $8.0*10^{-6}/°$ C., and the substrate has a CTE in a range from $4.2*10^{-6}/°$ C. to $4.4*10^{-6}/°$ C.

13. The power semiconductor device of claim 1, wherein the insulating layer is a first insulating layer, the device comprising:
a second insulating layer disposed between the substrate and the first insulating layer; and
a passivation layer disposed over the first insulating layer and the metal layer.

14. A power semiconductor device, comprising:
a substrate having an edge;
a first insulating layer disposed over the substrate;
a second insulating layer disposed over the first insulating layer;
a metal layer disposed over the second insulating layer and including a first portion and a second portion, the first portion having a first thickness and the second portion having a second thickness that is greater than the first thickness, the second portion being disposed farther apart from the edge of the substrate than the first portion and configured to function as a pad on which a wire bonding process is performed;
a passivation layer disposed over the second insulating layer and the metal layer;
a coating layer disposed over the passivation layer; and
a protective layer covering the substrate, the first insulating layer, the second insulating layer, the metal layer, the passivation layer, and the coating layer.

15. The power semiconductor device of claim 14, wherein the first thickness of the first portion is in a range from 20% to 60% of the second thickness of the second portion.

16. The power semiconductor device of claim 14, wherein the first thickness of the first portion is in a range from 1 µm to 2 µm, and the second thickness of the second portion is in a range from 4 µm to 5 µm.

17. The power semiconductor device of claim 14, wherein the first portion is spaced apart from the second portion by a distance in a range from 4 µm to 8 µm.

18. The power semiconductor device of claim 10, wherein the honeycomb structure of the coating layer includes an array of hollow cells, each of the hollow cells having a specific cross-section when seen in a top view and extending in a direction perpendicular to the cross-section, and the protective layer fills the hollow cells.

19. The power semiconductor device of claim 1, further comprising a passivation layer disposed over the insulating layer and the metal layer,
   wherein the edge of the substrate is a vertical outer edge of the substrate,
   wherein the level of the upper surface of the first portion is lower than that of the upper surface of the second portion.

20. A power semiconductor device, comprising:
   a substrate having an edge;
   an insulating layer disposed over the substrate;
   a metal layer disposed over the insulating layer and including a first portion and a second portion, the first portion having a first thickness and the second portion having a second thickness that is greater than the first thickness, the second portion being disposed farther apart from the edge of the substrate than the first portion and having the second thickness sufficiently large to function as a pad on which a wire bonding process is performed;
   a passivation layer disposed over the insulating layer and the metal layer;
   a coating layer disposed over the passivation layer; and
   a protective layer covering the substrate, the insulating layer, the metal layer, the passivation layer, and the coating layer.

\* \* \* \* \*